United States Patent
Ganapathiraman et al.

(10) Patent No.: US 7,202,159 B2
(45) Date of Patent: Apr. 10, 2007

(54) DIFFUSION BARRIERS COMPRISING A SELF-ASSEMBLED MONOLAYER

(75) Inventors: Ramanath Ganapathiraman, Clifton Park, NY (US); Ahila Krishnamoorthy, Virugambakkam (IN); Kaushik Chanda, Poughkeepsie, NY (US); Shyam P. Murarka, Clifton Park, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 99 days.

(21) Appl. No.: 10/809,317

(22) Filed: Mar. 24, 2004

(65) Prior Publication Data
US 2004/0180506 A1    Sep. 16, 2004

Related U.S. Application Data

(62) Division of application No. 09/976,927, filed on Oct. 11, 2001, now abandoned.

(60) Provisional application No. 60/244,160, filed on Oct. 27, 2000, provisional application No. 60/240,109, filed on Oct. 12, 2000.

(51) Int. Cl.
H01L 21/4763    (2006.01)
(52) U.S. Cl. .................. 438/623; 438/627; 438/687; 427/304; 427/305
(58) Field of Classification Search ................ 438/123, 438/623; 257/642
See application file for complete search history.

(56) References Cited

U.S. PATENT DOCUMENTS

| | | |
|---|---|---|
| 4,996,075 A | 2/1991 | Ogawa et al. |
| 5,057,339 A | 10/1991 | Oawa |
| 5,077,085 A | 12/1991 | Schnur et al. |
| 5,079,600 A | 1/1992 | Schnur et al. |
| 5,389,496 A | 2/1995 | Calvert et al. |
| 5,468,597 A | 11/1995 | Calabrese et al. |
| 5,500,315 A | 3/1996 | Calvert et al. |
| 5,510,216 A | 4/1996 | Calabrese et al. |
| 5,648,201 A | 7/1997 | Dulcey et al. |
| 5,939,150 A | 8/1999 | Stelzle et al. |
| 6,348,240 B1 | 2/2002 | Calvert et al. |

OTHER PUBLICATIONS

Van Zant, Microchip Fabrication, Fifth Ed. McGraw-Hill: New York, 2004, pp. 419-426.*

(Continued)

*Primary Examiner*—Carl Whitehead, Jr.
*Assistant Examiner*—Colleen E. Rodgers
(74) *Attorney, Agent, or Firm*—David J. Aston; Peters Verny, LLP

(57) ABSTRACT

The present invention provides a method for forming a diffusion barrier layer, a diffusion barrier in an integrated circuit and an integrated circuit. The method for forming a diffusion barrier involves the following steps: 1) preparing a silicon substrate; 2) contacting the silicon substrate with a composition comprising self-assembled monolayer subunits and a solvent; and, 3) removing the solvent. The diffusion barrier layer includes a self-assembled monolayer. The integrated circuit includes a silicon substrate, a diffusion barrier layer and a metal deposited on the diffusion barrier layer. The diffusion barrier layer in the integrated circuit is covalently attached to the silicon substrate and includes a self-assembled monolayer.

14 Claims, 3 Drawing Sheets

OTHER PUBLICATIONS

Ahrens, C. et al., "Electrical characterization of conductive and non-conductive barrier layers for Cu-metallization," Applied Surface Science, 1995, pp. 285-290, vol. 91.

Ding, P.J. et al., "Effects of the addition of small amounts of Al to copper: Corrosion, resistivity, adhesion, morphology, and diffusion," J. Appl. Phys., Apr. 1994, pp. 3627-3631, vol. 75(7).

Ding, P.J. et al., "Oxidation resistant high conductivity copper films," Appl. Phys. Lett. May 1994, pp. 2897-2899, vol. 64(21).

McBrayer, J.D. et al., "Diffusion of metals in silicon dioxide," J. Electrochem. Soc., Jun. 1986, pp. 1242-1246, vol. 133(6).

Raghavan, G. et al., "Diffusion of copper through dielectric films under bias temperature stress," Thin Solid Films, 2995, pp. 168-176, vol. 262.

Reed, M.A. and Tour, J.M., "Computing with molecules," Scientific American, Jun. 2000, pp. 86-93, vol. 282(6).

Sekiguchi, A. et al., "Microstructural and morphological changes during thermal cycling of Cu thin films," J. Japan Inst. Metals, Apr. 2000, pp. 379-382, vol. 64(5).

ASM Handbook vol. 5, Surface Engineering, ASM International: Materials Park, Ohio, 1994, pp. 315-318.

Porterfield, Inorganic Chemistry, A Unified Approach, Addison-Wesley: Reading, Massachusetts, 1984, pp. 487-488.

Moshfegh, A.Z. et al., Bias Sputtered Ta Modified Diffusion Barrier in Cu/Ta($V_b$)/Si(111) Multilayer Structure, Thin Solid Films, 370:10-17 (Jul. 2000).

Simon, Richard A. et al., "Synthesis and Characterization of a New Surface Derivatizing Reagent To Promote the Adhesion of Polyprrole Films to n-Type Silicon Photoanodes: $N$-(3-(Tarimethoxysilyl)pyrrole" J. Am. Chem. Soc., 104:2031-2034 (1982).

Yin, H. et al., "Nanostructured Iron-Nickel thin films synthesized by electroless polyol deposition," Mater. Phys. Mech., 4:56-61 (2001).

Wolf et al., "Silicon Processing for the ULSI Era," vol. 1—Process Technology, $2^{nd}$ Ed., Lattice Press; Sunset Beach, CA, 2000, pp. 438, 782-783.

* cited by examiner

DIFFUSION BARRIERS COMPRISING A SELF-ASSEMBLED MONOLAYER

RELATED CASES

This application is a divisional of U.S. patent application Ser. No. 09/976,927, now abandoned, filed Oct. 11, 2001, which claims priority to provisional Applications Nos. 60/240,109 entitled Diffusion Barriers Comprising A Self-Assembled Monolayer naming G. Ramanath, Ahila Krishnamoorthy, Kaushik Chanda and Shyam P. Murarka as inventors and filed Oct. 12, 2000 and 60/244,160 entitled Diffusion Barriers Comprising A Self-Assembled Monolayer naming G. Ramanath, Ahila Krishnamoorthy, Kaushik Chanda and Shyam P. Murarka as inventors and filed Oct. 27, 2000. These applications are incorporated herein for all purposes as if set forth herein in full.

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

A. Field of the Invention

The present invention generally relates to integrated circuits. In particular, it relates to forming a diffusion barrier layer comprising a self-assembled monolayer in an integrated circuit.

B. Description of Related Art

Copper is becoming the metal of choice for forming conductive patterns in integrated circuits. There are, however, unresolved issues with its use. For instance, copper diffuses rapidly in silicon and silicon dioxide. The diffusion, over time, results in junction linkage, which decreases device efficiency.

To address the problem of copper diffusion, researchers have developed "diffusion barriers." A diffusion barrier is part of the metallization scheme, comprising a layer of material formed between an overlying copper layer and an underlying silicon or silicon dioxide layer. The diffusion barrier serves to inhibit the diffusion of copper into the surrounding layer.

The use of amorphous alloys as diffusion layers has been discussed. Amorphous binary silicides, such as molybdenum-, tantalum and tungsten silicide and amorphous ternary alloys (e.g., Ti—Si—N) have been reported as diffusion barriers. The formation of these layers uses sophisticated processes, such as sputtering and/or chemical vapor deposition, or their variants. This results in the inclusion of substantial contaminants and residual stresses. Perhaps more importantly, these films have poor continuity and uniformity in non-planar structures.

Diffusion barriers made of TiN, TiSiN and TiN/TiSiN have also been reported. Many of the processes to form these layers involve treatments such as nitridation, oxidation, and post-deposition annealing.

While a number of diffusion barriers have been discussed in the art, improved diffusion barriers are desirable, especially those that are very thin and continuous.

SUMMARY OF THE INVENTION

The present invention provides a method for forming a diffusion barrier layer. The method involves the following steps: 1) preparing a silicon substrate; 2) contacting the prepared silicon substrate with a composition comprising self-assembled monolayer subunits and a solvent; and, 3) removing the solvent.

The present invention also provides a diffusion barrier in an integrated circuit. The diffusion barrier includes a self-assembled monolayer.

The present invention further provides an integrated circuit with a multilevel metallization scheme. The integrated circuit includes a silicon substrate, a diffusion barrier layer and a metal deposited on the diffusion barrier layer. The diffusion barrier layer is covalently attached to the silicon substrate and includes a self-assembled monolayer.

DESCRIPTION OF THE SPECIFIC EMBODIMENTS

A. Introduction

Figure 1:
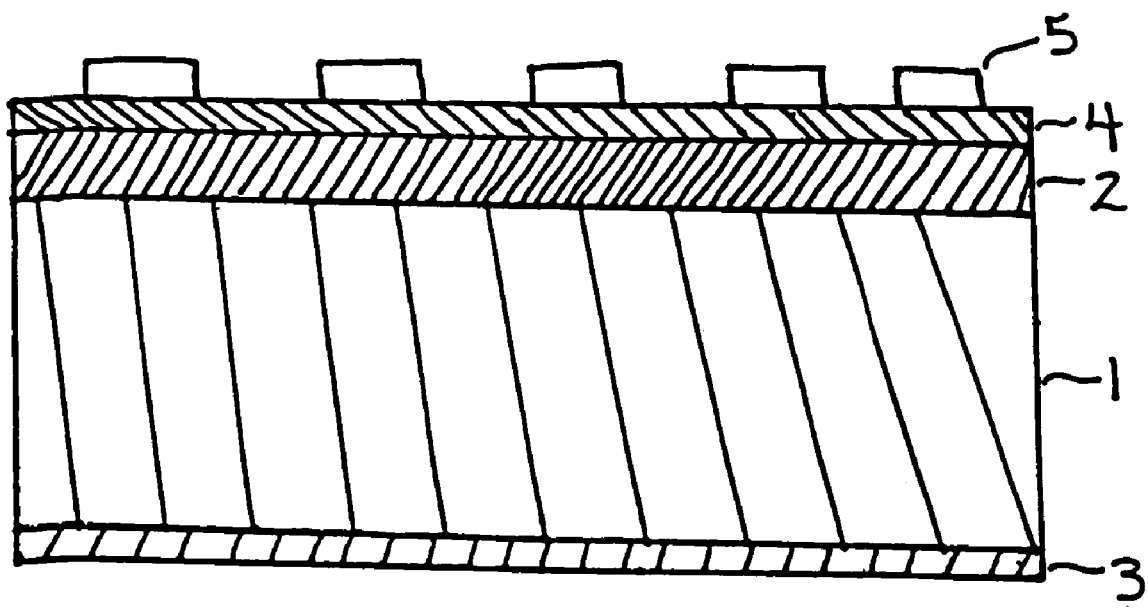
FIG. 1 shows a cross-sectional view of an MOS test structure comprising a self-assembled monolayer diffusion barrier layer.

The present invention provides a diffusion barrier in an integrated circuit, a method for forming the diffusion barrier and an integrated circuit containing the diffusion barrier. The diffusion barrier includes a self-assembled monolayer. Formation of the monolayer is typically done on the surface of a silicon substrate by contacting the substrate with monolayer subunits. The silicon substrate is represented by the formula $SiO_AX_B$, wherein A and B are $\geq 0$, and X is N, C, B, F, P or As. In particular, in addition to subscript A assuming particular values of 0, 1, and 2, fractional compositions are also envisioned and included. The value of subscript B is dependent upon the element X. The combination of silicon substrate and self-assembled monolayer serves as an integrated circuit element.

B. Composition Of Barrier Layer

The diffusion barrier layer includes a self-assembled monolayer. As the term is applied to the present invention, a "self-assembled monolayer" is a single layer of molecules that forms on a substrate surface when monolayer subunits are contacted with the surface under appropriate reaction conditions. The subunits are attached to the substrate at a first end; the second end of the molecule projects upward from the substrate surface. As surface sites on the surface are reacted with monolayer subunits, the single molecular layer is formed.

The subunits of the self-assembled monolayer are preferably attached to the substrate through a covalent bond. Typically, the substrate has reactive moieties extending from its surface (e.g., O, OH, $NH_2$, SH). The reactive moieties provide a point of covalent attachment to the subunit. For instance, $SiO_2$ is a typical substrate for monolayer formation. The hydroxylated $SiO_2$ surface provides OH groups that can covalently bind to substrates containing certain types of functional groups.

The first end of the self-assembled monolayer subunit typically includes a silicon atom to which three displaceable groups are attached. The second end typically includes a chemical group primarily composed of carbon. A preferred subunit is

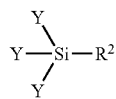

shown below (1):

Y is typically an O-alkyl group (e.g., $OCH_3$ or $OC_2H_5$) but can also be other displaceable groups such as Cl. $R^2$ is an alkyl group, heteroalkyl group, aryl group or heteroaryl group.

"Alkyl group" refers to a straight-chain, branched or cyclic group containing a carbon backbone and hydrogen. Examples of straight-chain alkyl groups include methyl, ethyl, propyl, butyl, pentyl and hexyl. Examples of branched alkyl groups include i-propyl, sec-butyl and t-butyl. Examples of cyclic alkyl groups include cyclobutyl, cyclopentyl and cyclohexyl.

Alkyl groups are substituted or unsubstituted. In a substituted alkyl group, a hydrogen on the carbon backbone is replaced by a different type of atom (e.g., oxygen, nitrogen, sulfur, halogen). For instance, 2-hydroxyethyl is an ethyl group where one of the hydrogens is replaced by an OH group; 2-chloropropyl is a propyl group where one of the hydrogens is replaced by a Cl group.

"Heteroalkyl group" refers to a straight-chain, branched or cyclic group containing a carbon-heteroatom backbone and hydrogen. Heteroatoms include, without limitation, oxygen, nitrogen and sulfur. Methyl ethylether (i.e., $CH_2OCH_2CH_3$) is an example of a straight-chain heteroalkyl group. As with alkyl groups, heteroalkyl groups are substituted or unsubstituted.

"Aryl group" refers to a carbocyclic aromatic group containing six carbon atoms (e.g., phenyl) or a carbocyclic aromatic group containing ten carbon atoms (e.g., naphthyl). An aryl group is substituted or unsubstituted. A substituted aryl group is one where at least one hydrogen atom of an aryl group has been replaced with a different type of atom (e.g., oxygen, nitrogen, sulfur, halogen). Examples of substituted aryl groups include the following: 2-chlorophenyl; 3-methylphenyl; and, 4 methoxyphenyl.

"Heteroaryl group" refers to an aromatic group containing both carbon atoms and heteroatoms. Examples of heteroaryl groups include pyridyl, furyl, pyrrolyl and imidazolyl. As with aryl groups, heteroaryl groups are substituted or unsubstituted. 2-Chloropyridyl is an example of a substituted heteroaryl group.

In one embodiment, the subunit is as shown in structure 2 ($R^2$ in structure 1 is a straight-chain alkyl):

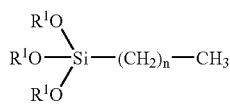

wherein $R^1$ is a straight-chain alkyl group and n is an integer $\geq 1$. Preferably n is an integer ranging from 1 to 5. Preferably, $R^1$ is methyl and n is 2.

In another embodiment, the subunit is as shown in structure 3 ($R^2$ in structure 1 is a substituted straight-chain alkyl):

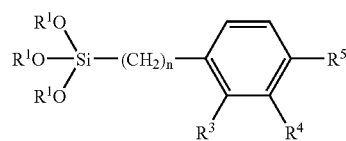

wherein $R^1$ is a straight-chain alkyl group, n is an integer $\geq 1$ and $R^3$, $R^4$ and $R^5$ are independently selected from the group consisting of hydrogen, alkyl groups, heteroalkyl groups, Br, Cl, F, I, $NH_2$, $NHR^6$, $NR^6R^7$, OH, $OR^6$, SH, $SR^6$, CHO, COOH and CN. $R^6$ and $R^7$ are alkyl groups or aryl groups. Preferably, n is an integer ranging from 1 to 5. Preferably, $R^1$ is methyl, $R^3$, $R^4$ and $R^5$ are hydrogen and n is 2.

In another embodiment, the subunit is shown in structure 4 ($R^2$ in structure 1 is a substituted straight-chain alkyl):

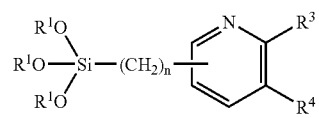

wherein $R^1$ is a straight-chain alkyl group, n is an integer $\geq 1$ and $R^3$ and $R^4$ are independently selected from the group consisting of hydrogen, alkyl groups, heteroalkyl groups, Br, Cl, F, I, $NH_2$, $NHR^6$, $NR^6R^7$, OH, $OR^6$, SH, $SR^6$, CHO, COOH and CN. $R^6$ and $R^7$ are alkyl groups or aryl groups. Preferably n is an integer ranging from 1 to 5. Preferably, $R^1$ is methyl, $R^3$, $R^4$ and $R^5$ are hydrogen and n is 2.

A preferred subunit of structure 4 is compound 5, shown below:

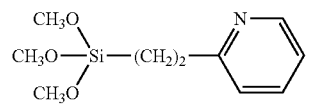

In another embodiment, the subunit is shown in structure 6 ($R^2$ in structure 1 is an aryl):

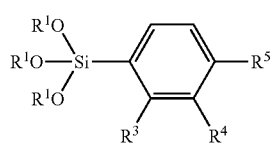

wherein $R^1$ is a straight-chain alkyl group, and $R^3$, $R^4$ and $R^5$ are independently selected from the group consisting of hydrogen, alkyl groups, heteroalkyl groups, Br, Cl, F, I, $NH_2$, $NHR^6$, $NR^6R^7$, OH, $OR^6$, SH, $SR^6$, CHO, COOH and CN. $R^6$ and $R^7$ are alkyl groups or aryl groups.

C. Process For Forming Barrier Layer

To form the self-assembled monolayer on the surface of a substrate, a substrate is first prepared. The substrate is typically cleaned, washed and dried. Contact of the prepared substrate with monolayer subunits in a suitable solvent and under appropriate reaction conditions attaches the subunits to the surface. Removal of the solvent provides the desired layer on the substrate.

In one embodiment, the substrate is a silicon wafer that has been oxidized to form an $SiO_2$ surface layer. The layer is typically cleaned using an organic solvent (e.g., xylene) or a series of organic solvents followed by a water wash. The wet wafer is dried, for example, by blow-drying it with $N_2$. Immersion of the dry wafer in an organic solvent (e.g., toluene) containing self-assembled monolayer subunits followed by heating the solution attaches subunits to the $SiO_2$ surface. The reacted substrate is washed with an organic solvent (e.g., toluene) and dried (e.g., blown dry with $N_2$).

D. Barrier Layer s Part f Device

Figure 3:
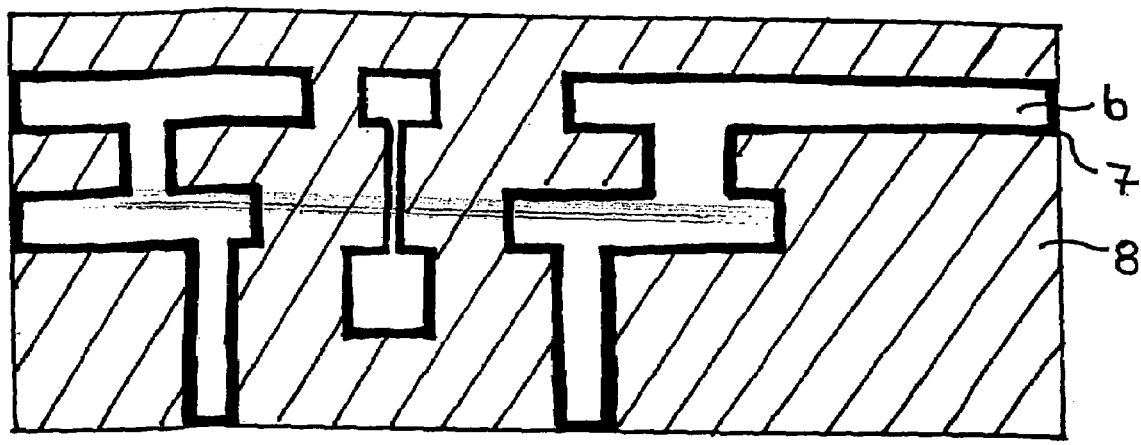
FIG. 3 shows a cross-sectional view of a two-level integrated circuit comprising a self-assembled monolayer diffusion barrier layer.

The present invention provides an integrated circuit comprising a self-assembled monolayer diffusion barrier. FIG. 1 shows an MOS test structure containing a self-assembled monolayer barrier layer. The MOS test structure contains the following elements: a silicon layer (1); a silicon dioxide layer (2) on the top side of the silicon layer; an aluminum back contact (3) on the bottom side of the silicon layer; a diffusion barrier (4) comprising a self-assembled monolayer; and, copper dots (5) deposited on the diffusion barrier. FIG. 3 shows a cross-sectional view of a two-level integrated circuit comprising a self-assembled monolayer diffusion barrier layer. The illustrated integrated circuit contains the following elements: a copper layer (6); a self-assembled monolayer diffusion barrier layer (7) that surrounds the copper layer; and, a silicon substrate (8) that includes the copper and diffusion barrier layers.

The self-assembled monolayer in the integrated circuit is composed of subunits. Where the subunits are covalently attached to a substrate surface, one representation of such a subunit is shown below (7, wavy lines represent covalent attachment to the substrate):

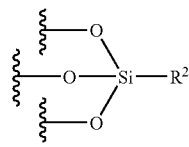

7 wherein $R^2$ is an alkyl group, heteroalkyl group, aryl group or heteroaryl group.

E. Metals Deposited on Diffusion Barrier

The diffusion barrier of the present invention serves to inhibit the diffusion of a deposited metal on the surface of the self-assembled monolayer through to the substrate underneath the monolayer. The barrier inhibits the diffusion of a variety of metals. In a preferred embodiment, the barrier inhibits the diffusion of copper.

F. EXAMPLES

1. Preparation of an MOS Test Structure.

A (100) oriented, B-doped, 5" diameter p-Si wafer was taken. It was RCA cleaned and oxidized in an ambient of dry $O_2$ at 900° C. to grow an oxide of 100 nm thickness. The back oxide was completely removed using buffered HF and a 0.3–0.4 µm-thick aluminum layer was sputter deposited to form a back contact. The resulting wafer was vacuum annealed at 400° C. for 30 minutes.

The vacuum annealed wafer was respectively cleaned in xylene, acetone and isopropyl alcohol followed by a thorough deionized water wash. The washed wafers were blown dry with $N_2$ and immersed in a 1% (by volume) solution of organosilane (i.e., self-assembled monolayer subunit) in toluene. The following subunits (purchased from Gelest Inc. of Tullytown, Pa.) were used in the process:

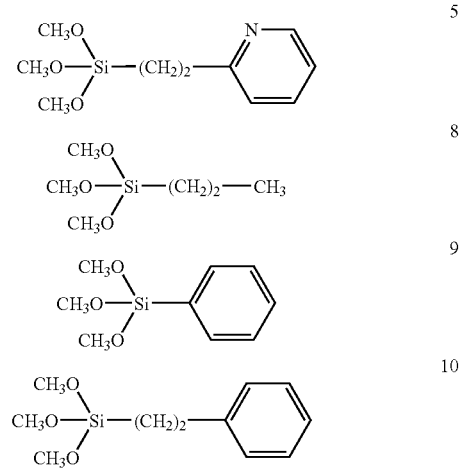

The wafer in the solution was heated from room temperature to 60° C. over 1 hour. The wafer was washed with toluene, blown dry with $N_2$ and baked on a heating plate for about 4 minutes at 120° C.

Copper dots of 1 mm diameter and 1.2 µm thickness were sputter deposited on the wafer monolayer, completing the preparation of the MOS test structure.

2. Bias Temperature Testing of MOS Test Structures

Figure 2:
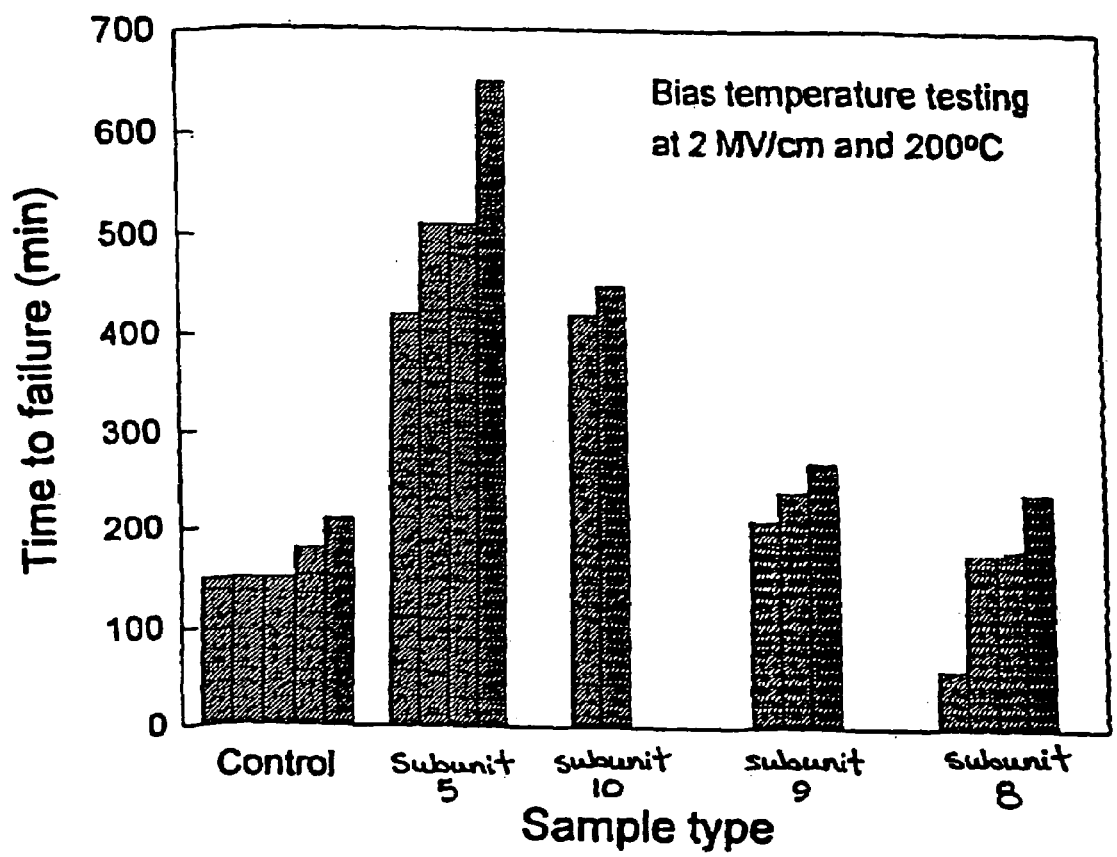
FIG. 2 shows a bar graph representing bias temperature testing of five different test structures.

Test structures prepared according to Example 1 were subjected to electrical testing. A control structure (no diffusion barrier) and four different structures comprising self-assembled monolayer diffusion barriers (diffusion barrier comprising subunits 5, 8, 9 and 10 respectively) were biased at 2 MV/cm and 200° C. for 30 minutes in nitrogen ambient. Failure of each respective specimen was recorded. FIG. 2 shows a bar graph representing several trials of each of the 5 structures and the failure time in minutes for each respective structure.

What is claimed is:

1. A method for forming a diffusion barrier layer between a copper metal layer and a silicon substrate comprising the steps of:
   a) preparing the silicon substrate;
   b) contacting the silicon substrate with a composition comprising self-assembled monolayer subunits and a solvent;
   c) removing the solvent thereby forming the diffusion barrier; and
   d) forming a copper metal layer on the diffusion barrier as formed in step (c) using a vapor deposition process, said diffusion barrier inhibiting copper diffusion into the substrate, wherein the self-assembled monolayer subunit is of the following structure:

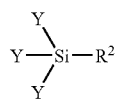

wherein Y is an O-alkyl group, and wherein R² is a group selected from

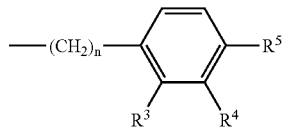

and

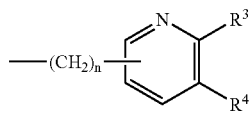

wherein R³, R⁴ and R⁵ are independently selected from the group consisting of hydrogen, alkyl groups, heteroalkyl groups, halo groups, $NH_2$, $NHR^6$, $NR^6R^7$, OH, $OR^6$, SH, $SR^6$, CHO, COOH and CN, and wherein $R^6$ and $R^7$ are alkyl groups, and wherein n is an integer ranging from 1 to 5.

2. The method of claim 1 wherein the self assembled monolayer subunit is of the following structure:

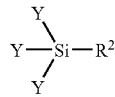

wherein Y is an O-alkyl group, and wherein R2 is an alkyl group, linked to an aryl group or heteroaryl group.

3. The method according to claim 2, wherein R² is an alkyl group of the following structure:

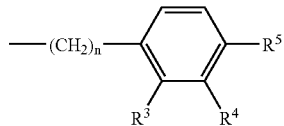

wherein R³, R⁴ and R⁵ are independently selected from the group consisting of hydrogen, alkyl groups, heteroalkyl groups, halo groups, $NH_2$, $NHR^6$, $NR^6R^7$, OH, $OR^6$, SH, $SR^6$, CHO, COOH and CN, and wherein $R^6$ and $R^7$ are alkyl groups, and wherein n is an integer ranging from 1 to 5.

4. The method according to claim 3, wherein Y is $OCH_3$.

5. The method according to claim 2, wherein R² is an heteroarvi group of the following structure:

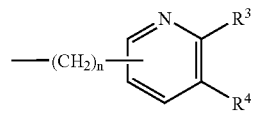

wherein R³ and R⁴ are hydrogen, and wherein n is an integer ranging from 1 to 5.

6. The method according to claim 5, wherein R³, R⁴ and R⁵ are hydrogen and n is 2.

7. The method according to claim 2, wherein Y is $OCH_3$.

8. The method according to claim 7, wherein R² is an alkyl group of the following structure:

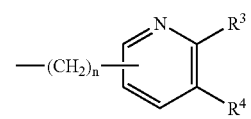

and wherein R³ and R⁴ are hydrogen and n is 2.

9. The method according to claim 1, wherein the silicon substrate preparation comprises the formation of a silicon oxide surface.

10. The method according to claim 1, wherein the method further comprises the step of heating the silicon substrate and the composition during contact.

11. A method of forming a device, the method comprising:
    (a) providing a substrate;
    (b) providing a diffusion barrier layer, wherein the diffusion barrier layer comprises a self-assembled monolayer, wherein the self-assembled monolayer is a single layer of molecules, and wherein the molecules in the self-assembled monolayer have first ends attached to the substrate and second ends, comprising aromatic groups, projecting upward from the substrate; and
    (c) forming a copper metal layer on the diffusion barrier layer as formed in step (b) using a vapor deposition process, wherein the copper in the metal layer is in direct contact with the second ends of the molecules in the self-assembled monolayer, and the diffusion barrier prevents diffusion of copper atoms into the substrate.

12. The method of claim 11 wherein the device is capable of being biased at about 2 MV/cm at about 200° C. for about 30 minutes without diffusion of the copper into the substrate.

13. The method of claim 11 wherein the substrate comprises silicon oxide on silicon.

14. The method of claim 11 wherein the vapor deposition process is a sputtering process.

* * * * *

UNITED STATES PATENT AND TRADEMARK OFFICE
CERTIFICATE OF CORRECTION

PATENT NO.        : 7,202,159 B2
APPLICATION NO. : 10/809317
DATED             : April 10, 2007
INVENTOR(S)       : G. Ramanath et al.

It is certified that error appears in the above-identified patent and that said Letters Patent is hereby corrected as shown below:

Column 8, line 3, "heteroarvi" should read --heteroaryl--.

Signed and Sealed this

Twenty-first Day of August, 2007

JON W. DUDAS
*Director of the United States Patent and Trademark Office*